(12) United States Patent
Perepezko et al.

(10) Patent No.: US 8,980,434 B2
(45) Date of Patent: Mar. 17, 2015

(54) MO—SI—B—BASED COATINGS FOR CERAMIC BASE SUBSTRATES

(75) Inventors: John Harry Perepezko, Madison, WI (US); Ridwan Sakidja, Madison, WI (US); Patrick Ritt, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 343 days.

(21) Appl. No.: 13/328,898

(22) Filed: Dec. 16, 2011

(65) Prior Publication Data
US 2013/0157064 A1 Jun. 20, 2013

(51) Int. Cl.
| | | |
|---|---|---|
| B05D 3/10 | (2006.01) |
| B32B 17/06 | (2006.01) |
| C04B 41/86 | (2006.01) |
| C04B 41/00 | (2006.01) |
| C04B 41/50 | (2006.01) |
| F01D 5/28 | (2006.01) |
| C23C 12/02 | (2006.01) |
| C23C 16/56 | (2006.01) |
| C23C 16/16 | (2006.01) |
| C23C 28/04 | (2006.01) |

(52) U.S. Cl.
CPC .......... B32B 17/06 (2013.01); C04B 41/86 (2013.01); C04B 41/009 (2013.01); C04B 41/5022 (2013.01); F01D 5/288 (2013.01); C23C 12/02 (2013.01); C23C 16/56 (2013.01); C23C 16/16 (2013.01); C23C 28/044 (2013.01); F05D 2300/2102 (2013.01); Y02T 50/672 (2013.01)

USPC .......... 428/432; 428/433; 428/428; 428/697; 428/702; 427/344

(58) Field of Classification Search
None
See application file for complete search history.

(56) References Cited

U.S. PATENT DOCUMENTS

| 4,883,639 A * | 11/1989 | Adlerborn et al. ............. 419/49 |
| 4,985,377 A * | 1/1991 | Iseki et al. ....................... 501/51 |
| 5,856,015 A * | 1/1999 | Buchanan ..................... 428/426 |
| 6,347,446 B1 * | 2/2002 | Luthra et al. ............... 29/402.18 |
| 7,300,702 B2 * | 11/2007 | Li et al. .......................... 428/446 |
| 2002/0032115 A1 * | 3/2002 | Oguri et al. ...................... 501/32 |
| 2003/0194574 A1 * | 10/2003 | Thebault et al. .............. 428/472 |
| 2010/0260970 A1 * | 10/2010 | Yeh et al. ....................... 428/141 |

OTHER PUBLICATIONS

Akinc et al., Characterization and oxidation behavior of silicide coating on multiphase Mo—Si—B alloy, Intermetallics, vol. 16, Aug. 15, 2008, pp. 1125-1133.

Crocker et al., Oxidation and Fracture of a Woven 2d Carbon—Carbon Composite, Carbon, vol. 29, No. 7, 1991, pp. 881-885.

Fu et al., Silicon carbide coating to protect carbon/carbon composites against oxidation, Scripta Materialia, vol. 52, Jan. 21, 2005, pp. 923-927.

(Continued)

Primary Examiner — David Sample
(74) Attorney, Agent, or Firm — Bell & Manning, LLC

(57) ABSTRACT

Alumina-containing coatings based on molybdenum (Mo), silicon (Si), and boron (B) ("MoSiB coatings") that form protective, oxidation-resistant scales on ceramic substrate at high temperatures are provided. The protective scales comprise an aluminoborosilicate glass, and may additionally contain molybdenum. Two-stage deposition methods for forming the coatings are also provided.

16 Claims, 13 Drawing Sheets

(56) References Cited

OTHER PUBLICATIONS

Buchanan et al., Oxidation Protection of Carbon—Carbon Composites Using Chemical-Vapour-Deposition and Glaze Technology, Corrosion Science, vol. 35, Nos. 5-8, 1993, pp. 1243-1250.

Drexler et al., Air-plasma-sprayed thermal barrier coatings that are resistant to high-temperature attack by glassy deposits, Acta Materialia, vol. 58, Dec. 2010, pp. 6835-6844.

Ehrburger et al., Inhibition of the Oxidation of Carbon—Carbon Composite by Boron—Oxide, Carbon, vol. 24, No. 4, 1986, pp. 495-499.

Isobe et al., Structure and thermal resistance of chemically vapor deposited molybdenum on graphite, J. Vac. Sci. Technol. A, vol. 4, No. 6, Nov./Dec. 1986, pp. 3046-3049.

Li et al., A $MoSi_2$—SiC—Si oxidation protective coating for carbon/carbon composites, Surface & Coatings Technology, vol. 201, Mar. 15, 2007, pp. 9444-9447.

Liu et al., Preparation and oxidation protection of CVD SiC/a-BC/SiC coatings for 3D C/SiC composites, Corrosion Science, vol. 51, Feb. 6, 2009, pp. 820-826.

Li et al., Mullite-$Al_2O_3$—SiC oxidation protective coating for carbon/carbon composites, Carbon, vol. 41, 2003, pp. 2825-2829.

Li et al., A modified dual-layer SiC oxidation protective coating for carbon/carbon composites prepared By one-step pack cementation, Corrosion Science, vol. 53, Oct. 1, 2010, pp. 523-527.

Mitra et al., Oxidation behaviour of the Mo—Si—B and Mo—Si—B—Al alloys in the temperature range of 700-1300° C., Intermetallics, vol. 15, Apr. 25, 2007, pp. 1217-1227.

Park et al., Coating designs for oxidation control of Mo—Si—B alloys, Scripta Materialia, vol. 46, Jun. 7, 2002, pp. 765-770.

Sakidja et al., Phase stability and structural defects in high-temperature Mo—Si—B alloys, Acta Materialia, vol. 56, Aug. 27, 2008, pp. 5223-5244.

Perepezko et al., Synthesis of oxidation resistant silicide coatings on Mo—Si—B alloys, Scripta Materialia, vol. 53, Jun. 20, 2005, pp. 723-728.

Zhang et al., Oxidation protection of C/SiC coated carbon/carbon composites with Si—Mo coating at high temperature, Corrosion Science, vol. 53, Feb. 20, 2011, pp. 2075-2079.

Li et al., Mo—Si—B Alloys Oxidation Protective Coating for SiC-Coated Carbon/Carbon Composites, Surface Review and Letters, vol. 16, No. 2, 2009, pp. 223-229.

Wuchina et al., UHTCs: Ultra-High Temperature Ceramic Materials for Extreme Environment Applications, The Electrochemical Society Interface, Winter 2007, pp. 30-36.

Levine et al., Evaluation of Ultra-High Temperature Ceramics for Aeropropulsion Use, Structural Ceramics and Ceramic Composites for High Temperature Applications. Conference, Seville, Spain, Jul. 10, 2001.

\* cited by examiner

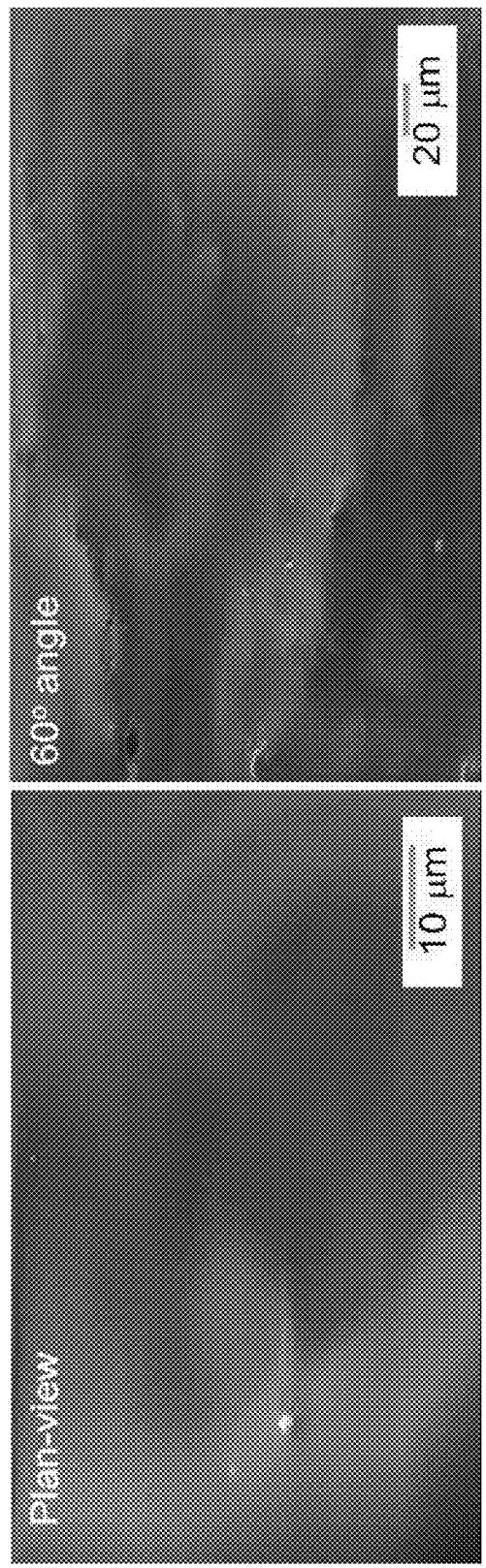

MO—SI—B—BASED COATINGS FOR CERAMIC BASE SUBSTRATES

REFERENCE TO GOVERNMENT RIGHTS

This invention was made with government support under grant number NNX08AB35A awarded by NASA and grant number N00014-08-1-1208 awarded by the Office of Naval Research. The government has certain rights in the invention.

BACKGROUND

Ultra-high temperature ceramics (UHTCs), SiC-based ceramic matrix composites (CMCs) and cermets are promising high temperature materials. There is significant interest in using these types of ceramic-based materials in jet engines and other hypersonic vehicles. However, in order to do so, the materials need protective coatings to withstand the harsh high temperature oxidative environments to which they are exposed during use. In addition, in environments where these materials are exposed to sand under extreme conditions, the coatings must be resistant to attack and degradation by the sand.

A conventional method for protecting ceramic materials from oxidation is to rely upon an in-situ generated $SiO_2$ scale at the surface of the ceramic. Such scales may be generated from SiC present in the ceramic. However, although $SiO_2$ inhibits oxidation at high temperatures, at very high temperatures (e.g., ≥1350° C.) volatile $SiO(g)$ can form instead, thereby degrading the oxidation-resistant properties of the scale.

Conventional coatings for protecting ceramics from attack by sand, such as calcium-magnesium-alumino-silicate (CMAS), utilize a glass overlay, a sealant or dewetting layer over an underlying thermal barrier coating. However, as a result of thermal cycling during the operation of turbine engines which use these coatings, the coatings crack and erode. Atmospheric plasma spray coatings have also been used. However, the microstructure of these coatings is characterized by microcracks, porosity and splat boundaries which render them susceptible to CMAS infiltration.

SUMMARY

One aspect of the invention provides methods for coating ceramic-based substrates with a coating formed from molybdenum, silicon and boron. The methods use a two stage deposition process that comprises the steps of depositing a layer of molybdenum metal onto a surface of the substrate and subsequently co-depositing silicon and boron onto the layer of molybdenum, in the presence of alumina, to form a continuous MoSiB coating comprising an aluminoborosilicate phase on the surface of the substrate. When the coated ceramic-based substrates are heated in an oxidizing environment they form a continuous layer of glass over the surface of the substrate, wherein the glass comprises an aluminoborosilicate. The continuous glass layer reduces or inhibits the formation of volatile species in the scale that forms at the surface of the substrate at high temperatures in an oxidizing environment and reduces the rate at which oxygen diffuses through the scale. In addition, the continuous glass coating can provide protection from reactions with and/or infiltration into the coating by sands, such as CMAS.

Ceramic-based substrates that can be coated in accordance with the present methods include ultra-high temperature ceramics, such as $SiC$—$ZrB_2$ composites; fiber-reinforced matrix composites, such as carbon fiber-reinforced SiC matrix composites and SiC fiber-reinforced SiC matrix composites; and refractory metal cermets, such as hafnium nitride and zirconium nitride cermets.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

FIGS. 9(a) and (b) show SEM images of a continuous glass scale comprising an aluminoborosilicate over a SiC—SiC substrate.

DETAILED DESCRIPTION

Figure 1:
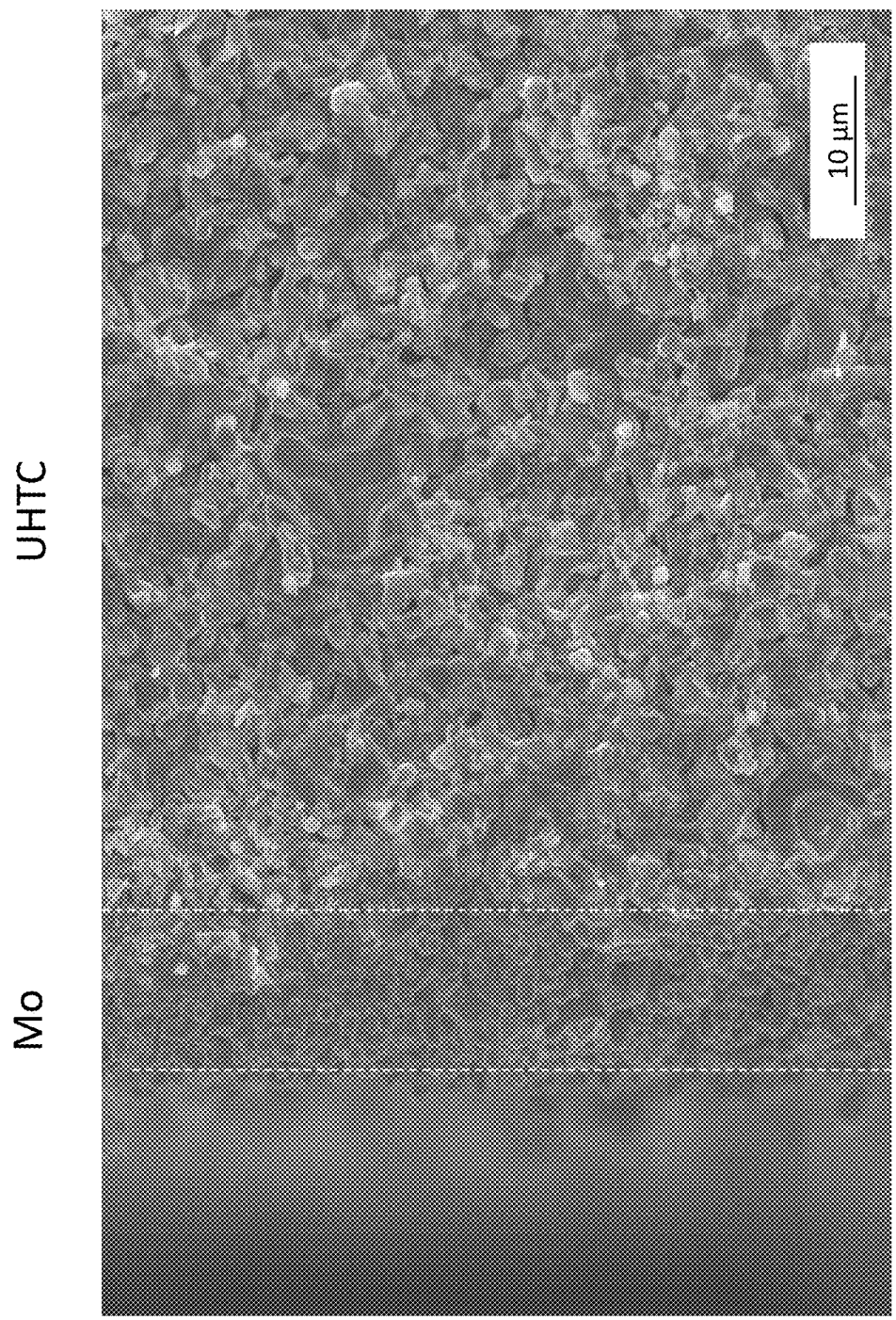
FIG. 1 shows a scanning electron microscope (SEM) image of a layer of molybdenum metal on an ultra-high temperature ceramic substrate.

The present application relates to alumina-containing coatings based on molybdenum (Mo), silicon (Si), and boron (B) ("MoSiB coatings") that form protective, oxidation-resistant scales on ceramic substrates at high temperatures. The deposited coating is a multiphase coating comprising phases that include Mo, Si, and/or B, at least one of which is an aluminoborosilicate phase. The protective scales formed from the coatings comprise a continuous layer of aluminoborosilicate glass, and may additionally contain boron and molybdenum, which act as glass modifiers. The coatings are able to provide a continuous protective silicate glass layer over a substrate surface, even at low coating thicknesses.

Examples of ceramic substrates on which the coatings can be formed are boride, carbide, nitride and oxide ceramics.

Included among these are ultra-high temperature ceramics (UHTCs) having melting points of at least 1600° C. and, more desirably, at least 3000° C. Examples of these are borides, carbides and nitrides of the Group IVa and Va elements. The ceramic substrates can comprise a single ceramic material or a composite material in which the ceramic forms a composite with another ceramic material or with a metal.

Composite ceramic materials include ceramic matrix composites (CMCs), which are composed of a fiber-reinforced ceramic matrix material. CMCs include carbon fiber-reinforced SiC (SiC—C) and SiC fiber-reinforced SiC (SiC—SiC). Other composite ceramic materials include composites of diboride ceramics (e.g., $ZrB_2$ and $HfB_2$) and silicon carbide. (SiC). When composite ceramics are used as a base substrate, the volume fraction of the ceramics that make up the composite can vary over a broad range, depending on the desired properties. For example, a composite substrate comprising a diboride ceramic and silicon carbide can be a diboride-rich substrate (i.e., comprising >50 volume % diboride) or a SiC-rich substrate (i.e., comprising >50 volume % SiC). Thus, by way of illustration only, the present coatings can be applied to SiC—$ZrB_2$ coatings having a SiC volume fraction of 80% to 20% (i.e., 20% to 80% $ZrB_2$). Although substrates with volume fractions outside this range can also be used. The coatings are desirably applied to a substrate with which they have limited, or no, detrimental chemical interaction, as in the case of MoSiB coatings on SiC. However, optionally, a barrier layer can be inserted between the substrate and the coating in order to limit detrimental chemical interactions.

Composite materials also include cermets comprising metal particles dispersed in a ceramic matrix or ceramic particles dispersed in a metal matrix. Cermets that can benefit from the present coatings include refractory metal cermets. Specific examples include metal carbide cermets, metal nitride cermets and metal boride cermets, such as Mo—ZrC, Mo—ZrN and W—HfN cermets.

The ceramic substrates may be in the form of bulk material or may take the form of a coating layer on another underlying substrate. For example, the ceramic substrate can be a ceramic thermal barrier coating on an underlying turbine blade substrate. Yttria-stabilized zirconia is an example of one such thermal barrier coating.

The coatings can be formed using a two-step deposition process. In the first step, Mo is deposited onto a surface of the substrate at an elevated temperature. This deposition step can be carried out using chemical vapor deposition (CVD) with a molybdenum-containing precursor, such as a molybdenum carbonyl (e.g., $Mo(CO)_6$). The CVD process is advantageous because it can be carried out at relatively low temperatures (e.g., 250° C.). Other suitable deposition techniques for the first step include plasma deposition using a plasma spray. A plasma spray deposition is advantageous because it can be used to coat a large surface area in a relatively short time. In a second step, after the molybdenum has been deposited, silicon and boron are deposited simultaneously in the presence of alumina. This can be accomplished via pack cementation using a pack that includes silicon, boron and aluminum oxide. The alumina in the coating can play an important role in the glass scale formed from the coating at high temperatures by reducing the loss of silica in the scale via the formation of volatile species and by reducing the rate at which oxygen diffuses through the scale.

By first forming a layer of Mo metal on the substrate surface, followed by the co-deposition of Si and B, the present methods result in the formation of a continuous MoSiB coating on the surface of a substrate. (As used herein, the term "MoSiB" is not intended to refer to any particular ratio of the elements MoSiB, as the exact composition of the coating will vary somewhat depending on the deposition conditions. In addition, the "MoSiB coatings" can include elements in addition to Mo Si and B. As explained elsewhere in this disclosure, other elements may be present in minor amounts in order to enhance the performance characteristics of the coatings.) The present methods can be distinguished from attempts to co-deposit Mo, Si and B simultaneously onto a substrate, which fail to form a continuous MoSiB coating on the substrate and result in the formation of a discontinuous, cracked layer of borosilicate glass when the coated substrate is exposed to high temperatures. (See, Feng et al., *Surface Review and Letters*, 16, 223-229 (2009)).

The specific compositions of the deposited MoSiB coatings and the silicate-containing scale that forms when the coatings are oxidized can vary depending upon the ratios of elements used in the deposition process. For example, when alumina is used at a concentration of about 62.5 weight percent in the cement pack, aluminum may be present at a concentration of about 6 atomic percent in the aluminoborosilicate glass scale that forms after exposure of the resulting coating to high temperatures (e.g., ≥1600° C.). However, aluminoborosilicate glasses having higher or lower aluminum concentrations can also be formed, including, but not limited to, aluminum concentrations in the ranges from 1 to 15 atomic percent and from 2 to 10 atomic percent. In addition, other elements, including other metals and metalloids can be present in the coatings. For example, one or more refractory metals (e.g., tungsten (W) or zirconium (Zr)) can be included in the Mo metal layer deposited in the first step in order to provide a MoSiB coating that is more chemically inert toward, or that has a closer coefficient of thermal expansion with, the underlying ceramic substrate.

The viscosity of the glass that forms when the present MoSiB coatings are exposed to high temperatures, can be tailored by adjusting the Si to B ratio in the coating to allow for good flow, which results in a continuous and smooth glass layer. However, the amount of boron in the coating should not be so high that boria formation and evaporation degrades the protective properties of the resulting glass. In general the MoSiB coatings will include a mixture of the T1 ($Mo_5Si_3$) and T2 ($Mo_5SiB_2$) phases of MoSiB in amounts that provide for fully continuous coverage of the substrate. Thus, the ratio of Si to B will depend on the relative amounts of these phases. Therefore, the minimum ratio of Si to B in the coating will be about 1.3:1 in embodiments where only T2 is present. However, in embodiments of the coatings where T2 is a minority element, the weight ratio of Si to B is desirably no greater than 35, this includes embodiments in which the weight ratio is no greater than 30.

When the MoSiB-coated ceramic substrates are exposed to high temperatures (e.g., ≥1200° C.) for a period of time, they form a layer of aluminoborosilicate glass over the surface of the substrate. The thickness of this glass layer can vary, depending upon the intended application. However, even relatively thin (e.g., ≤10 μm or 5≤ μm) coatings are able to provide significantly enhanced oxidation resistance, as demonstrated by the examples, below.

The extent to which the present coatings protect an underlying ceramic substrate can be measured by the weight change experienced by the coated substrate in an oxidizing atmosphere at high temperatures relative to that experienced by an uncoated substrate under the same conditions. For example, a SiC—$ZrB_2$ substrate tends to gain weight when exposed to an oxidizing environment at high temperatures due to the uptake of oxygen during the formation of $ZrO_2$ in the surface scale. The present coatings are able to drastically reduce the formation of the $ZrO_2$ in the surface scale of such substrates. For example, some embodiments of the present coatings are characterized by an ability to provide a weight gain for a MoSiB-coated SiC—$ZrB_2$ substrate that is no more than 15%, no more that 12%, or even no more that 10% of the weight gain experienced by the same SiC—$ZrB_2$ substrate in the absence of the coating, when the substrates are exposed to a temperature of 1200° C. for a period of 120 minutes in an oxidizing environment pressurized at 20% $O_2$ and 80% Ar at a coating thickness of 5 μm or less.

In contrast to SiC—$ZrB_2$ coatings, some CMC composites, such as SiC—C composites lose weight in an oxidizing environment at high temperatures due to the burning off of the carbon fibers in the composite. The present coatings are able to drastically reduce the loss of carbon fibers under high-temperature oxidizing conditions. For example, some embodiments of the present coatings are characterized by an ability to provide a weight loss for a MoSiB-coated SiC—C substrate that is no more than 20%, no more that 18%, or even no more that 15% of the weight loss experienced by the same SiC—C substrate in the absence of the coating, when the substrates are exposed to a temperature of 1500° C. for a period of 6 hours in an oxidizing environment of ambient air at a coating thickness of 5 μm or less.

Like some CMC composites, cermets can lose weight in an oxidizing environment at high temperatures. This weight loss can be attributed to the formation of volatile oxides. While some less-volatile oxides remain, these are not effective oxygen barriers. Moreover, the molar volume change upon oxidation is significant and can act to compromise the integrity of the cermet. As in the case of the CMCs, the present coatings are able to drastically reduce the weight loss experienced by cermets under high-temperature oxidizing conditions.

EXAMPLES

The following examples illustrate the present coatings, methods for forming the coatings, and the protective properties of the coatings.

Example 1

MoSiB Coating on SiC—$ZrB_2$ Substrates

This example illustrates the application of a continuous MoSiB coating on SiC—$ZrB_2$ substrates having SiC:$ZrB_2$ volume fraction ratios of 80:20; 65:35; 35:65; and 20:80.

Mo Deposition:

A layer of molybdenum was applied to the surface of the SiC—$ZrB_2$ substrates using CVD with molybdenum hexacarbonyl as the molybdenum precursor species. The deposition was carried out on a targeted sample placed at the center of a quartz/alumina tube. The $Mo(CO)_6$ powders, which were used as feed materials, were placed in a separate alumina boat and positioned in the quartz/alumina tube at the entrance of a furnace. The tube was then evacuated and backfilled with argon to create an inert environment and to prevent oxidation. When the temperature of the furnace reached 225-250° C., the boat was advanced to the center of the tube so as to yield the Mo deposition. In this temperature range, the thermodynamics of molybdenum sublimation are favorable following the chemical reaction:

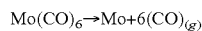

$$Mo(CO)_6 \rightarrow Mo + 6(CO)_{(g)}$$

The CO gas is produced as a by-product and Mo deposits on the surface of the UHTC. Details on experimental procedures for Mo deposition by means of Mo carbonyl decomposition can be found in Y. Isobe, et al., *Journal of Vacuum Science & Technology a-Vacuum Surfaces and Films,* 4 (1986) 3046-3049.

Si and B Deposition:

Si and B were deposited onto the substrates through pack cementation. A Si+B pack cementation process was employed to produce a silicide coating by enriching the surface of the substrate with Si and B via vapor-phase diffusion. Briefly, the pack cementation process involves the elevated temperature deposition of Si and B, carried by volatile metal-halide vapor species to the substrate embedded in a mixed powder pack containing powder of the deposition element, a halide salt activator, and an inert filler. For Si+Bi-pack cementation, a powder mixture composed of 62.5 wt. % $Al_2O_3$, 34.03 wt. % Si, 0.7 wt. % B (i.e., a total Si+B=35 wt %). And 2.5 wt. % NaF was loaded in an alumina crucible together with the clean alloy pieces followed by sealing the $Al_2O_3$ slurry bond. The prepared crucible was annealed at 1000° C. for 50 hours in an argon atmosphere. Details of experimental procedures of the Si+B pack cementation process on Mo-based MoSiB alloys can be found in R. Sakidja, et al., *Scripta Materialia,* 53 (2005) 723-728.

Oxidation Testing:

Oxidation tests of uncoated and coated substrates were carried out at temperature of up to 1650° C. in a furnace and up to 1750° C. under a torch.

Characterization:

The MoSiB coatings, before and after oxidation testing, were characterized using scanning electron microscopy (SEM), energy-dispersive x-ray spectroscopy (EDS), and thermogravimetric analysis (TGA).

Figure 2:
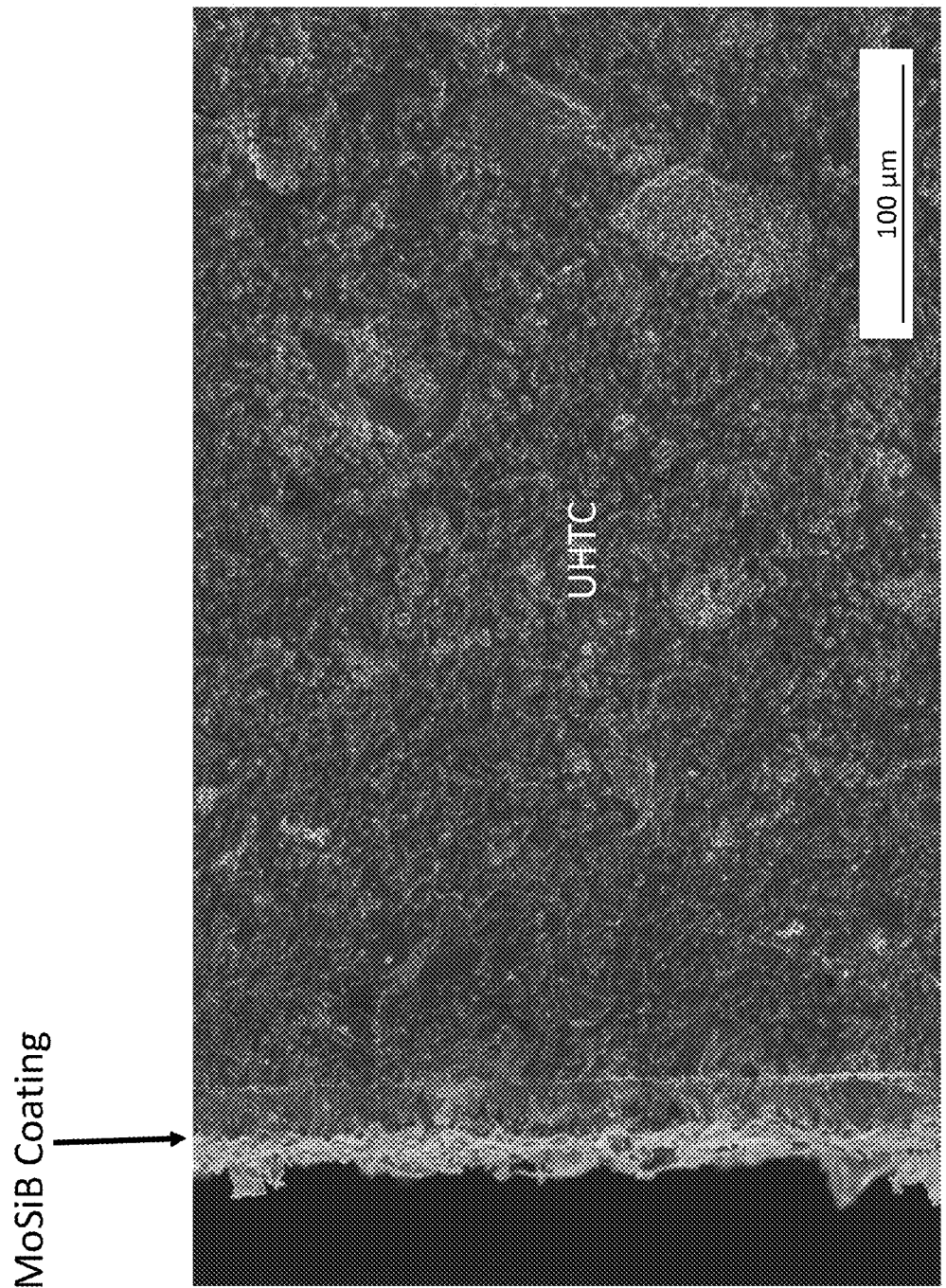
FIG. 2 shows an SEM image of a continuous MoSiB coating on an ultra-high temperature ceramic substrate.
Figure 3:
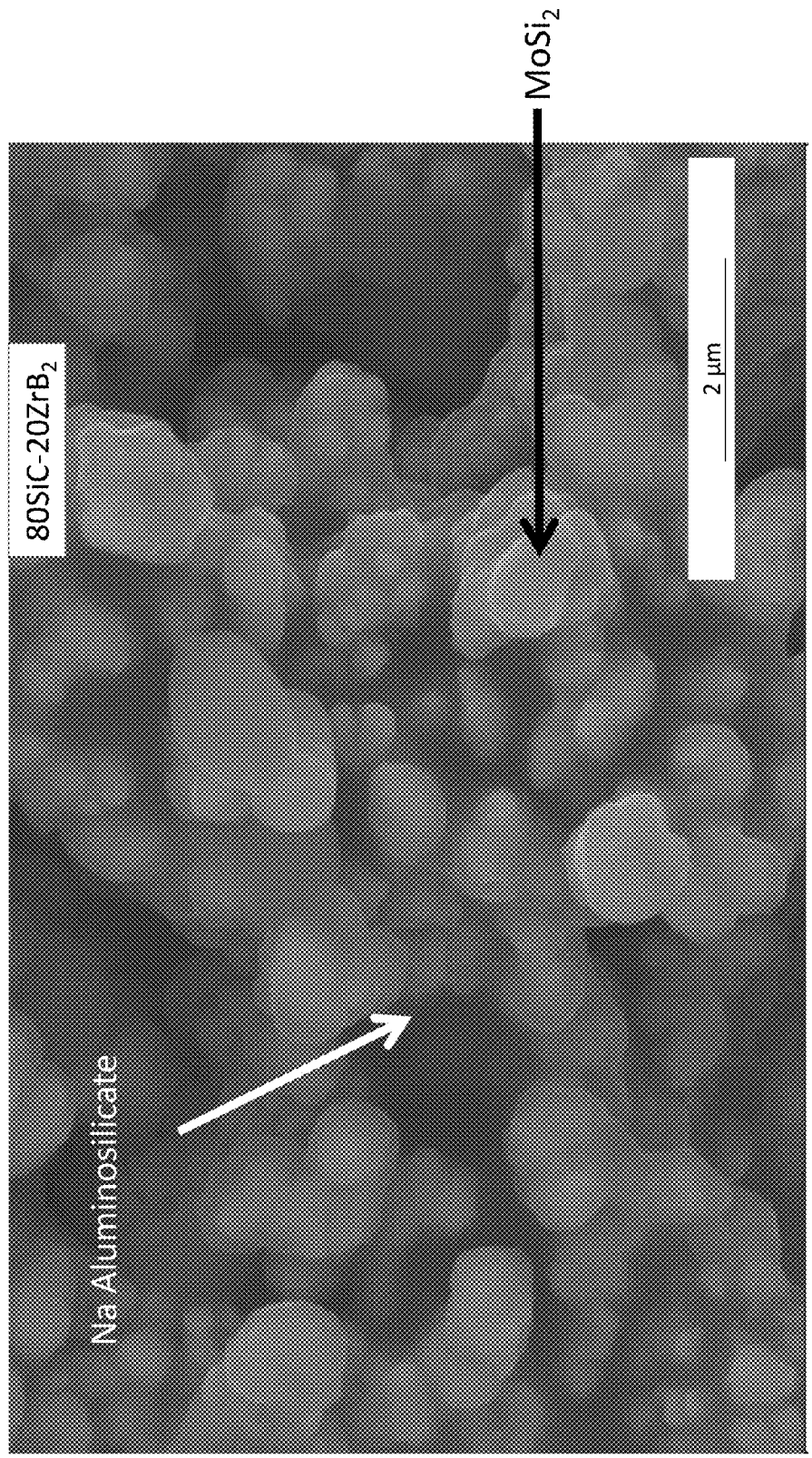
FIG. 3 shows an SEM image of a MoSiB coating that includes sub-micron sized $MoSi_2$ grains and a sodium aluminoborosilicate glass phase.

Results—SiC Rich Composite Substrate:

SEM images of each of the coated substrates revealed that the two-step deposition process formed a continuous MoSiB coating on the substrate surface. FIG. 1 shows a continuous layer of Mo on an 80 SiC-20 $ZrB_2$ substrate after the first step of the process. FIG. 2 shows an STM image of a continuous MoSiB coating on the same substrate after the second step of the process. High resolution SEM analysis in combination with EDS confirmed that the continuous MoSiB coating was comprised of sub-micron sized $MoSi_2$ grains, having relatively random crystallographic orientations, and aluminoborosilicate glass. FIG. 2 shows the SEM image of a MoSiB coating on 80SiC-20$ZrB_2$ having a sodium aluminoborosilicate phase present along with $MoSi_2$ grains.

Figure 4:
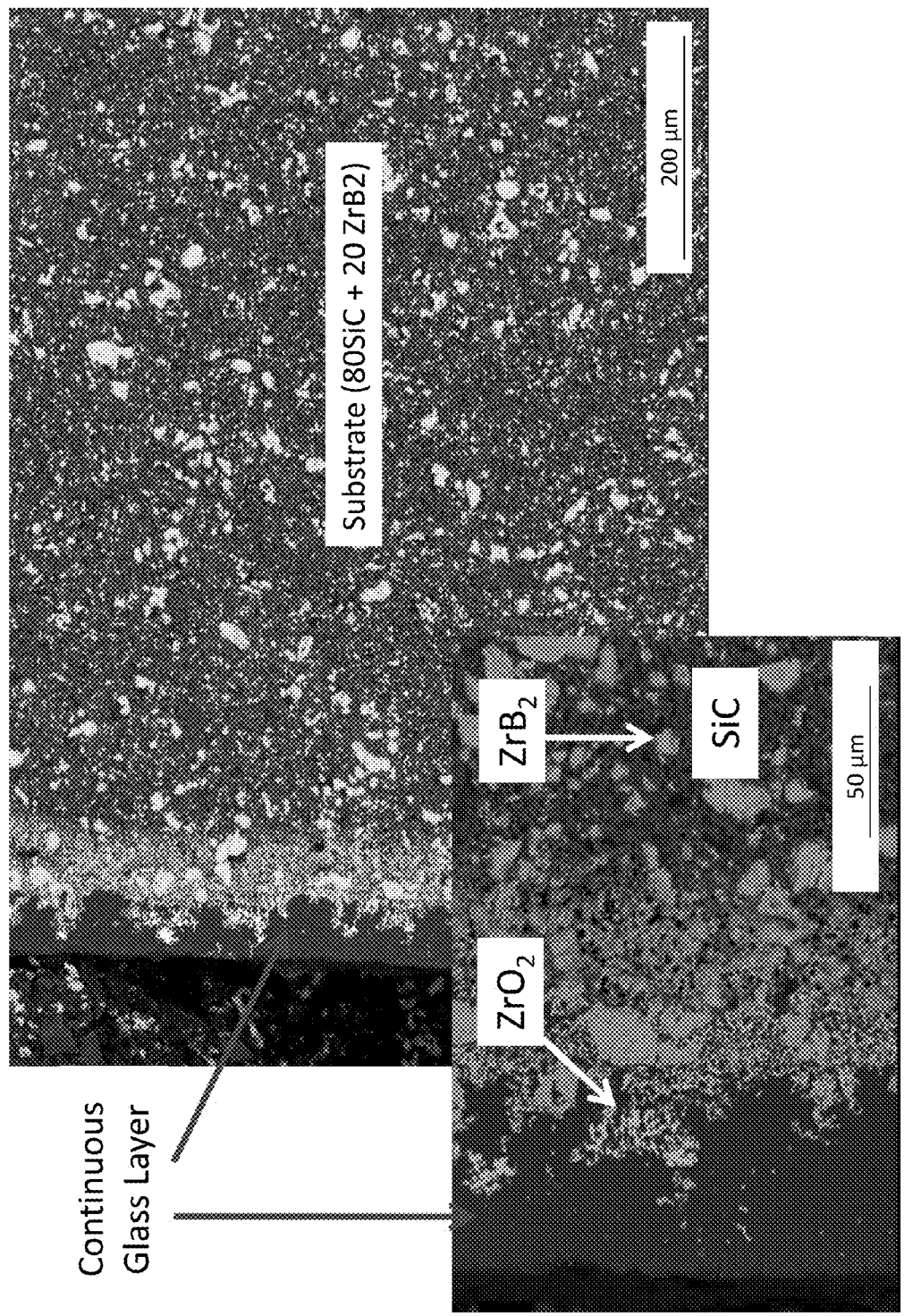
FIG. 4 shows an SEM image of a continuous glass scale comprising an aluminoborosilicate over an $80SiC$-$20ZrB_2$ substrate.
Figure 5:
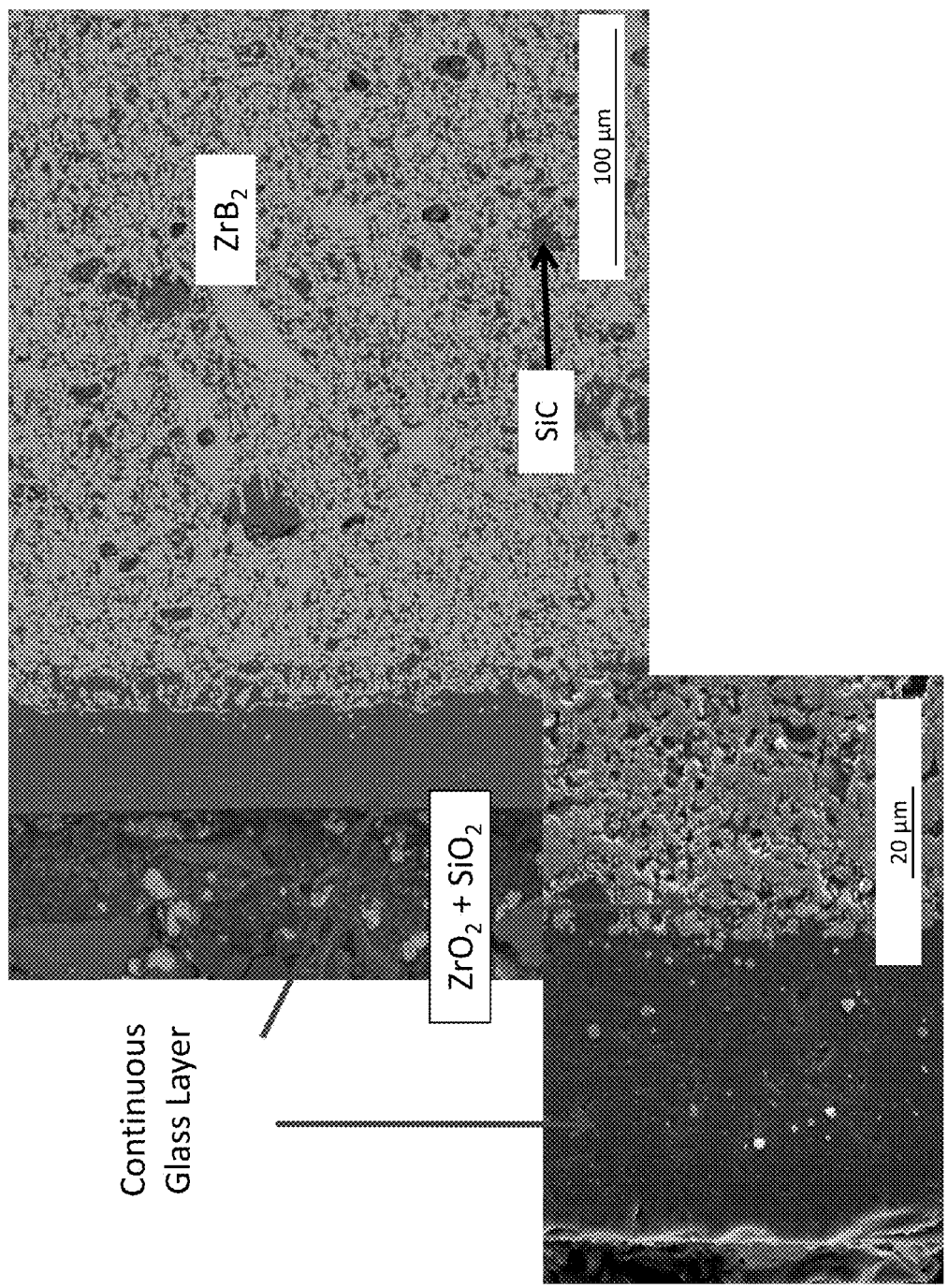
FIG. 5 shows an SEM image of a continuous glass scale comprising an aluminoborosilicate over a $20SiC$-$80ZrB_2$ substrate.

Oxidation testing of the 80SiC-20$ZrB_2$ substrate was carried out at 1650° C. for 5 hours. The results are shown in FIG. 4, which is the SEM image of the oxidation-tested coated substrate. In the image, a continuous (i.e., unbroken-uncracked) aluminoborosilicate glass layer can be seen covering the surface of the underlying substrate. The enlarged inset further shows a very limited degree of $ZrO_2$ formation between the bulk substrate and the protective aluminoborosilicate glass layer. In contrast, an uncoated 80SiC-20$ZrB_2$ substrate that was oxidized at 1650° C. for 5 hours developed a thick and viscous silica scale with non-continuous dispersions of $ZrO_2$. Thicker regions of the scale developed cracks, likely during cooling due to the mismatch in the coefficients of thermal expansion between the SiC—$ZrB_2$ and the $SiO_2$. The limited fluidity and the porous nature of the scale provided lower oxidation resistance. The comparison of these results shows that the aluminoborosilicate glass layer provided by the present MoSiB coatings significantly improved the oxidation resistance of the SiC-rich composite ceramic by limiting the growth of $ZrO_2$.

Results—ZrB$_2$ Rich Composite Substrate:

Oxidation testing of the 20SiC-80ZrB$_2$ substrate was carried out at 1650° C. for 5 hours. The results are shown in FIG. 4, which is the SEM image of the oxidation-tested coated substrate. In the image, a continuous (i.e., unbroken-uncracked) aluminoborosilicate glass layer can be seen covering the surface of the underlying substrate. The enlarged inset further shows a very limited degree of ZrO$_2$ and SiO$_2$ formation between the bulk substrate and the protective aluminoborosilicate glass layer. In contrast, an uncoated 20SiC-80ZrB$_2$ substrate that was oxidized at 1650° C. for 5 hours developed a scale having SiO$_2$ at its outer surface, a relatively thick and fast-growing layer of ZrO$_2$ and SiO$_2$ underlying the SiO$_2$, and an even thicker layer of SiC-depleted, porous ZrB$_2$ region between the ZrO$_2$/SiO$_2$ layer and the underlying bulk substrate. These comparative results show that the aluminoborosilicate glass layer provided by the present MoSiB coatings significantly improved the oxidation resistance of the ZrB$_2$-rich composite ceramic by limiting the growth of ZrO$_2$ particles due to reduced oxygen mobility through the aluminoborosilicate scale. These results were confirmed by thermogravimetric analysis (TGA) of the coated and uncoated samples, which showed a dramatic weight gain over the course of two hours due to oxygen uptake and ZrO$_2$ formation for the uncoated sample, but very little weight gain for the coated sample over the same time period.

Example 2

MoSiB Coating on SiC—C Matrix Composite Substrates

This example illustrates the application of a continuous MoSiB coating on SiC—C substrates composed of bundles of carbon fibers in a matrix of SiC. The substrates were fabricated by infiltrating carbon fibers with Si liquid, which reacted to provide an SiC matrix, followed by coating the top and bottom of the structure with SiC. The external coating of SiC was about 30 to 40 μm thick.

Mo Deposition:

A layer of molybdenum was applied to the surface of the SiC—C substrates using CVD with molybdenum hexacarbonyl as the molybdenum precursor species, according to the method described in Example 1.

Si and B Deposition:

Si and B were deposited onto the substrates through pack cementation in the presence of Al$_2$O$_3$ at 1000° C., according to the method described in Example 1.

Oxidation Testing:

Oxidation tests of uncoated and coated substrates were carried out at temperature of up to 1500° C. in a furnace.

Characterization:

The MoSiB coatings, before and after oxidation testing, were characterized using scanning electron microscopy (SEM), energy-dispersive x-ray spectroscopy (EDS), and thermogravimetric analysis (TGA).

Figure 6B:
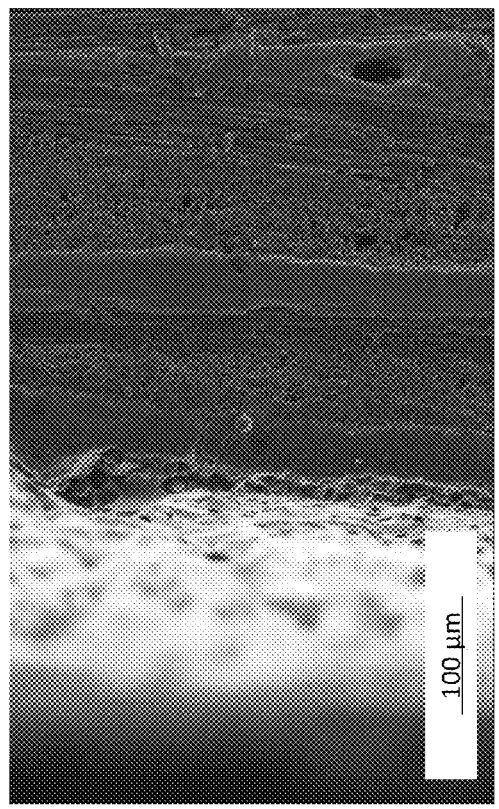
FIGS. 6(a) and (b) show SEM images of a MoSiB coating on a SiC—C composite ceramic substrate after oxidation at 800° C. for 6 hours.
Figure 6A:
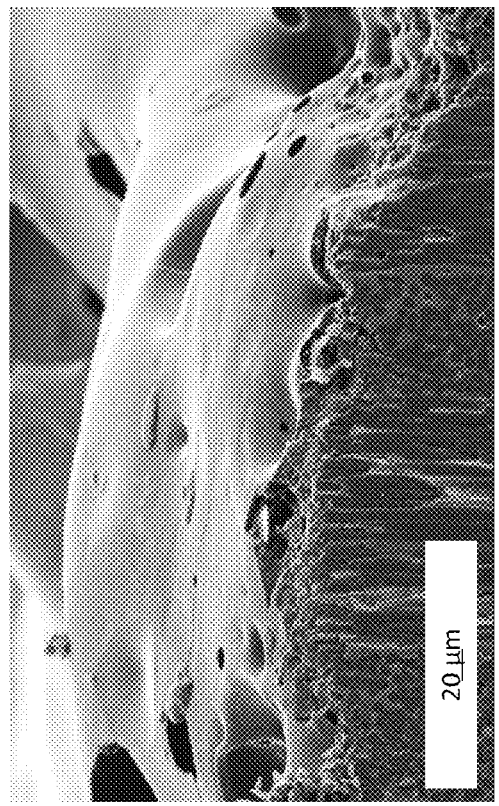
Figure 7B:
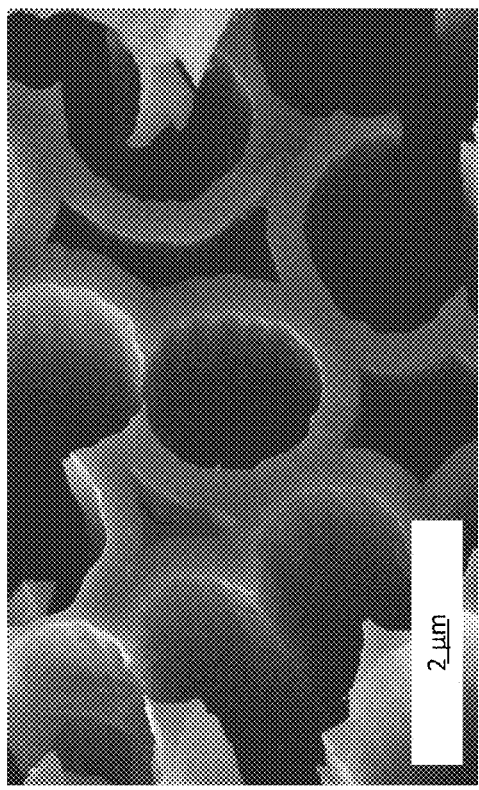
FIGS. 7(a) and (b) show SEM images of an uncoated SiC—C composite ceramic substrate after oxidation at 800° C. for 6 hours.
Figure 7A:
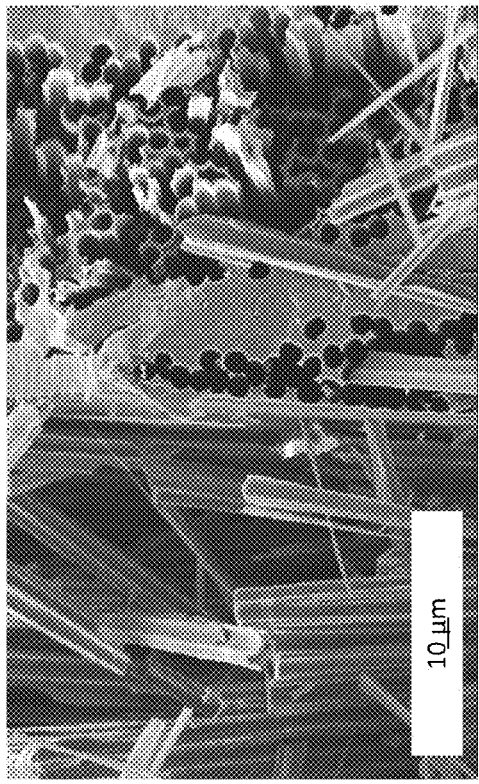

Results:

Oxidation testing the SiC—C substrate was carried out at 800° C. for 6 hours. The results are shown in FIGS. 6(a) and (b), which are the SEM images of the oxidation-tested coated substrate. As shown in the image, even after the oxidation testing, the structure of the composite material remained intact, with the carbon fibers maintained in the structure and a protective scale on the surface of the substrate. In contrast, when an uncoated SiC—C substrate underwent the same oxidation testing, only the SiC skeleton of the structure remained, the carbon fibers having been burned off by oxidation, as shown in FIGS. 7(a) and (b). The oxidation resistant nature of the coatings was confirmed by TGA analysis of the samples which showed a mass loss of only 1.35% after the oxidation tests for the coated sample, compared to a mass loss of 51.3% after the oxidation tests for the uncoated sample.

Figure 8:
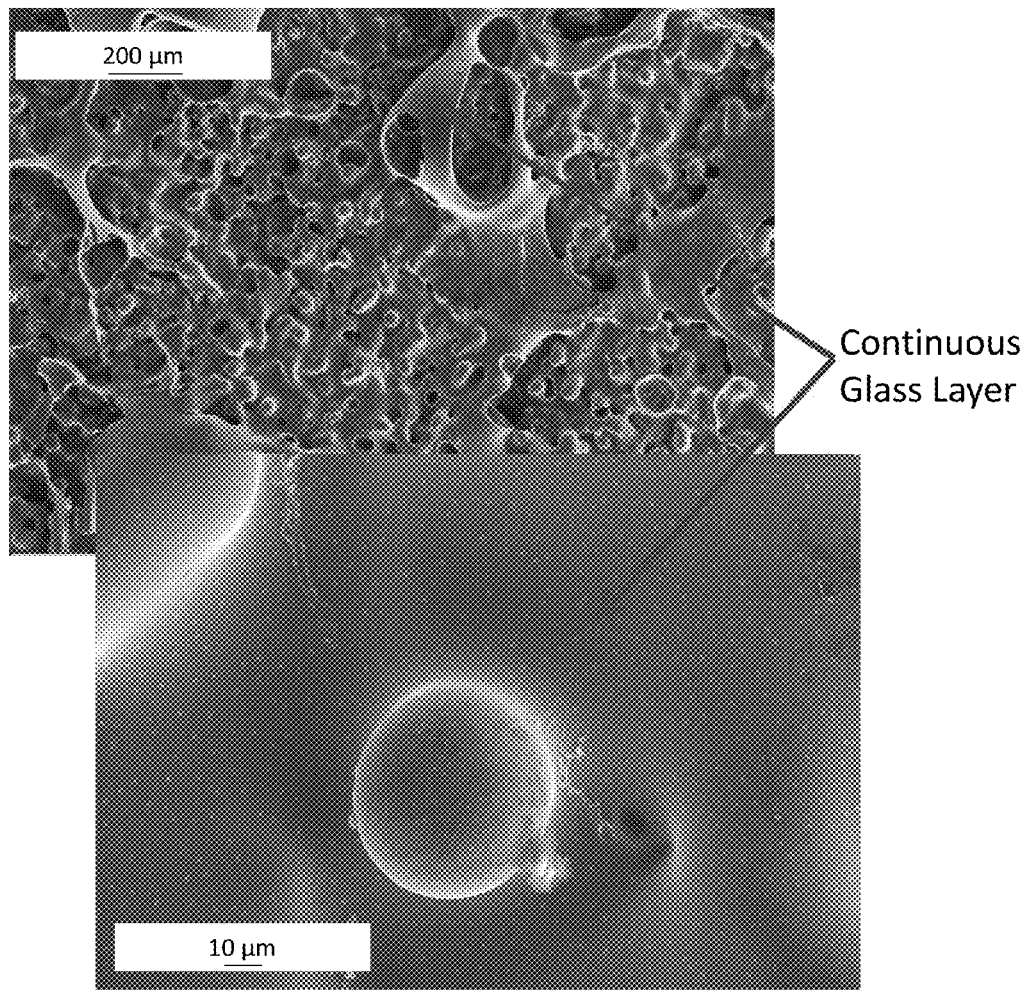
FIG. 8 shows an SEM image of a continuous glass scale comprising an aluminoborosilicate over a SiC—C substrate.

Further oxidation testing of coated and uncoated samples was carried out by exposing the samples to a temperature of 1500° C. for six hours. Again, the coated composite structure remained intact throughout the oxidation testing, experiencing a mass loss of only 6.06%, while the carbon fibers in the uncoated substrate were burned off, leaving a severely oxidized, porous SiC matrix skeleton, corresponding to a mass loss of over 40%. An SEM image of the coated SiC—C substrate after oxidation testing is shown in FIG. 8. As shown in the figure, the coated SiC—C developed a continuous protective glass layer on the surface of the substrate, which EDS analysis revealed to comprise aluminoborosilicate.

Example 3

MoSiB Coating on SiC—SiC Matrix Composite Substrates

This example illustrates the application of a continuous MoSiB coating on SiC—SiC substrates composed of bundles of SiC fibers in a matrix of SiC.

Mo Deposition:

A layer of molybdenum was applied to the surface of the SiC—SiC substrates using CVD with molybdenum hexacarbonyl as the molybdenum precursor species, according to the method described in Example 1.

Si and B Deposition:

Si and B were deposited onto the substrates through pack cementation in the presence of Al$_2$O$_3$ at 1000° C., according to the method described in Example 1.

Oxidation Testing:

Oxidation tests of uncoated and coated substrates were carried out at temperature of up to 1373° C. in a furnace.

Characterization:

The MoSiB coatings, before and after oxidation testing, were characterized using scanning electron microscopy (SEM).

Figures 10A, 10B:
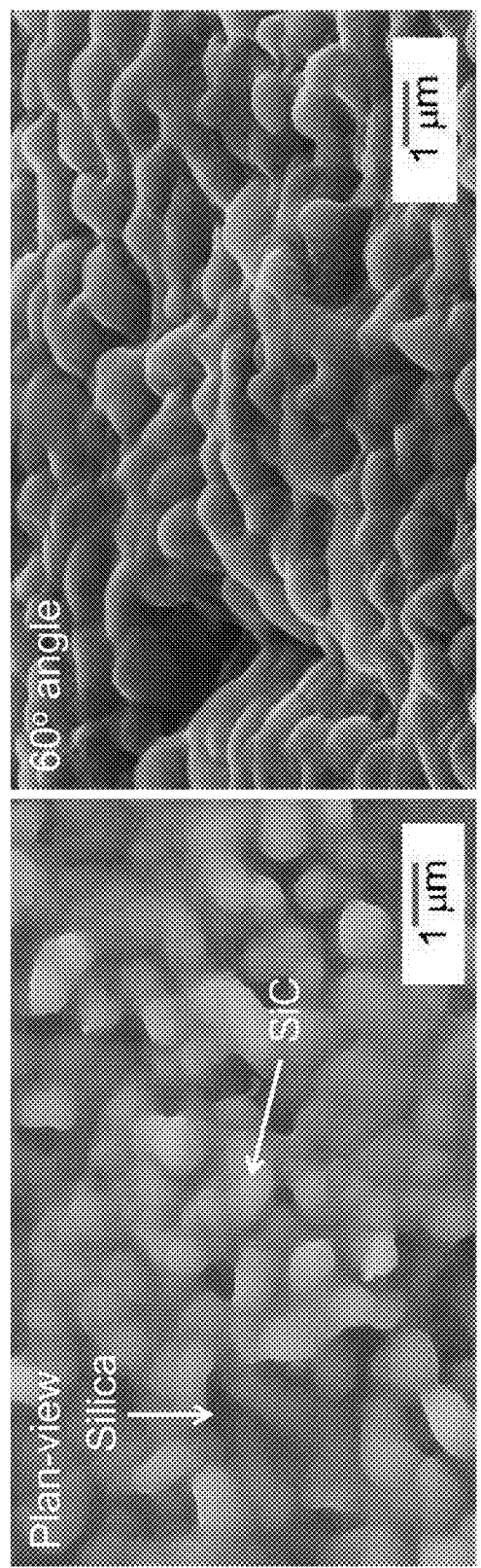
FIGS. 10(a) and (b) show SEM images of a continuous glass scale comprising a silica glass over a SiC—SiC substrate.

Results:

Oxidation testing the MoSiB coated SiC—SiC substrate was carried out at 1373° C. for 20 hours. SEM images of the resulting coated substrates are presented in FIGS. 9(a) and (b), which show a composite substrate with a protective glass layer having a smooth appearance—indicative of a relatively low viscosity coating. The relatively low viscosity of the glass formed from the MoSiB coating facilitates the continuous coverage of the substrate surface. In contrast, the SEM images of an uncoated SiC—SiC substrate after the same oxidation testing are shown in FIGS. 10(a) and (b). The silica glass that forms on the surface of this substrate fails to provide a smooth surface due to the high viscosity, low fluidity of the glass.

Example 4

MoSiB Coating on Refractory Metal Cermet Substrates

This example illustrates the application of a continuous MoSiB coating on W—HfN and Mo—ZrN cermets.

Cermet Synthesis:

The starting materials used for the preparation of ZrN—Mo and HfN—W cermets containing 40 vol. % metals (above percolation threshold) were ZrN and HfN (99.5% pure, −325 mesh), Mo (99.95% pure, 3-7 μm particle size), and W (99.95% pure, 1-2 μm particle size). All materials were purchased from Cerac Inc. (Milwaukee, Wis.). The powders were mixed with the mortar and pestle in acetone. The mixing procedure was repeated three times with intermediate drying. All samples were hot pressed (Model 912G, Thermal Technology, Santa Rosa, Calif.) at 1900° C. for 1 hour 20 MPa in He.

The relative density of the hot pressed materials was in the range of 96-99% of theoretical density. Phase composition of the samples was characterized by x-ray diffractometry (XRD, Siemens Theta/Theta, Model D 500), and microstructure by the Scanning Electron Microscopy (SEM, Model ISI ABT SR-50A, Withington, Manchester, United Kingdom and Model LEO 1530 Gemini, Carl Zeiss NTS GmbH, Oberkochen, Germany). Oxidation resistance was characterized by mass changes of the samples after furnace heating in air for 1 hour. The bars of average surface area about 1.0 cm$^2$ were supported by their ends on alumina semi-rings for maximum contact with the atmosphere.

Mo Deposition:

A molybdenum layer was deposited onto the cermet samples through the decomposition of Mo(CO)$_6$ via CVD. Due to the relatively low temperature for decomposition of Mo(CO)$_6$ the bonding between the Mo layer and cermet substrate is expected to be purely mechanical. One way to increase the bonding strength is to increase the surface roughness of the sample. Therefore, to facilitate adhesion, the cermet samples were etched in a solution of HCl, HNO$_3$, and HF acids for five minutes prior to the deposition of the initial Mo coating. A 32 mm outer diameter by 610 mm length quartz tube with one closed end was used to contain the reaction in a furnace. The cermet samples were placed in an alumina boat and positioned in the quartz tube such that the samples were inserted in the hottest zone of the furnace. Approximately three grams of Mo(CO)$_6$ powder was placed into a separate alumina boat and positioned in the quartz tube at the entrance of the furnace. To ensure that there was a minimal amount of oxygen in the system, the quartz tube was evacuated and backfilled with argon to create an inert environment. The furnace was then heated to a temperature of 225° C., at which point the boat filled with carbonyl powder was inserted into the furnace next to the alumina boat with the samples. At this temperature, the carbonyl sublimates and then decomposes forming molybdenum that deposits on the tungsten.

Si and B Deposition:

Si and B were deposited onto the Mo-coated cermet samples using the pack cementation process as described in the previous examples. The powder mixture used for pack cementation consisted of 2% NaF, 34.028% Si, 0.972% B, and the remainder Al$_2$O$_3$ powder.

Characterization:

The X-ray patterns of the hot-pressed samples showed the presence of only the nitrides and metals, indicating good chemical compatibility between the components. The chemical compatibility was also confirmed by SEM micrographs, which showed sharp ceramic-metal interfaces. The internal section and polished surface images revealed a uniform dispersion of nitride particles within the refractory metal matrix.

Figure 11:
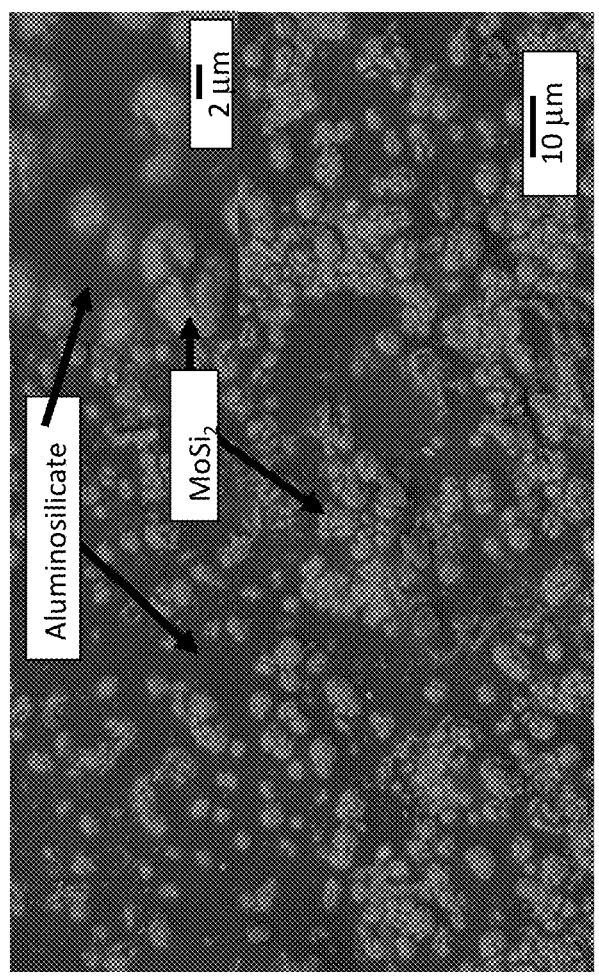
FIG. 11 shows an SEM image of an Mo—ZrN substrate coated with a protective coating comprising a layer of aluminoborosilicate glass.

Results:

The cross section view of the Mo coated W—HfN cermet revealed uniform cermet microstructure as well as the adhesion of the Mo coating. Following the pack cementation coating synthesis the Mo coating was converted into an outer layer of MoSi$_2$ and silicate. The coating adherence was maintained and the cermet microstructure was unaltered by the pack cementation coating synthesis process. The coating demonstrated good adhesion even around the sample corners. The pack cementation coating surface exhibited a mixture of MoSi$_2$+MoB matrix and aluminoborosilicate that displaces the original HfN or ZrN phase as shown in FIG. 11. A continuous aluminoborosilicate layer was observed on the Mo-coated and pack-cementated cermets whereas droplets of the aluminoborosilicate were observed in the pack-cementated-only cermets. In both cases, sodium originated from the NaF powder source was detected in the glass.

For the uncoated cermet samples, catastrophic oxidation was observed after an exposure in air at 800° C. for one hour with the large volume change due to oxidation of the nitride particles clearly evident. In contrast, the full integrity of the coated cermet samples was maintained after oxidation exposure at 1200° C. and 1400° C. Cross sectional and surface images revealed that the original coating structure was retained after oxidation exposure. Moreover, the cross sectional image of the Mo—ZrN indicated that the cermet microstructure was unaltered after oxidation exposure. A similar result was obtained for the coated W—HfN cermet. Due to the accompanying expansion of volume upon oxidation of either HfN or ZrN, the presence of an oxygen affected zone underneath the coating would be clearly evident.

Based on the relative mass changes for pack cementation coatings made with and without an Mo layer, it was evident that the precursor Mo coating operation, prior to pack cementation, is a key factor in limiting the oxidation attack. With the initial Mo surface layer the reaction with the Si and B during co-deposition provides for a uniform and complete surface coverage that can act to minimize the initial transient period where the most significant mass change occurs during oxidation exposure. The measured mass gain after one hour at 1400° C. was 3.3 mg/cm$^2$ for the coated Mo—ZrN sample which is comparable to that found for the 1200° C. one hour exposure.

Example 5

Resistance of MoSiB Coatings to Attack by CMAS

This example illustrates the resistance of continuous MoSiB coatings to infiltration by CMAS.

CMAS Composition:

Two types of sand with the same average composition were examined (referred to herein as A and C1). Both types of sand had the structure of the CMAS powder described in the literature. (See M. P. Borom, C. A. Johnson, and L. A. Peluso, Role of Environmental Deposits and Operating Surface Temperature in Spallation of Air Plasma Sprayed Thermal barrier Coatings, Surf. Coat. Technol., 1996, 86-87(1), p. 116-126.) The particle size of sand A was courser than that of sand C1.

Si and B Deposition:

The MoSiB coating was applied to the Mo substrate by a pack cementation process as described in the previous examples. The powder mixture for the pack cementation process was composed of 35 wt. % Si+B (Si:B=35:1), 2.5 wt. % NaF, and 62.5 wt. % Al$_2$O$_3$.

The coating contained a small amount of Al and Na as a byproduct of the NaF-activated pack cementation process. After pack cementation all coated specimens were conditioned at 1600° C. for 2 hours to develop a MoSiB coating.

Characterization:

To confirm the interaction between the MoSiB coatings and the CMAS, a predetermined amount of the sand was deposited on the top surface of the coated specimens. The CMAS-covered samples were then subjected to oxidation exposure in air. These samples were put into alumina boat, with CMAS coating side facing up. Three oxidation exposure schedules were employed: (1) oxidized at 1200° C. in air 2 h/10 h/25 h/50 h; (2) oxidized at 1400° C. in air 2 h/10 h/25 h/50 h; and (3) oxidized at 1500° C. in air 2 h/10 h/25 h/50 h.

The CMAS-interacted samples were cut in half to examine their cross-sections which were polished and sputtered with a coating of Au for examination by scanning electron microscopy.

Results:

The layered structure resulting from the interaction between the coating and the CMAS sand was observed in SEM images of the polished cross sections of the samples. The coatings provided excellent oxidation resistance by producing a continuous layer of aluminoborosilicate glass between the CMAS and the Mo substrate.

Figure 12:
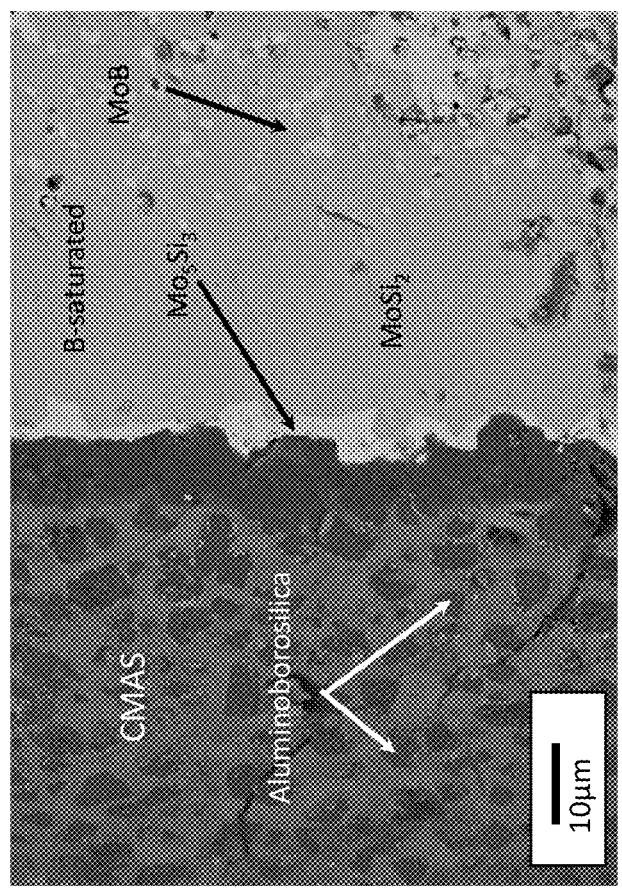
FIG. 12 shows an SEM image of a cross-section of an Mo substrate coated with a multilayered MoSiB-based coating that includes a layer of aluminoborosilicate glass.
Figure 13:
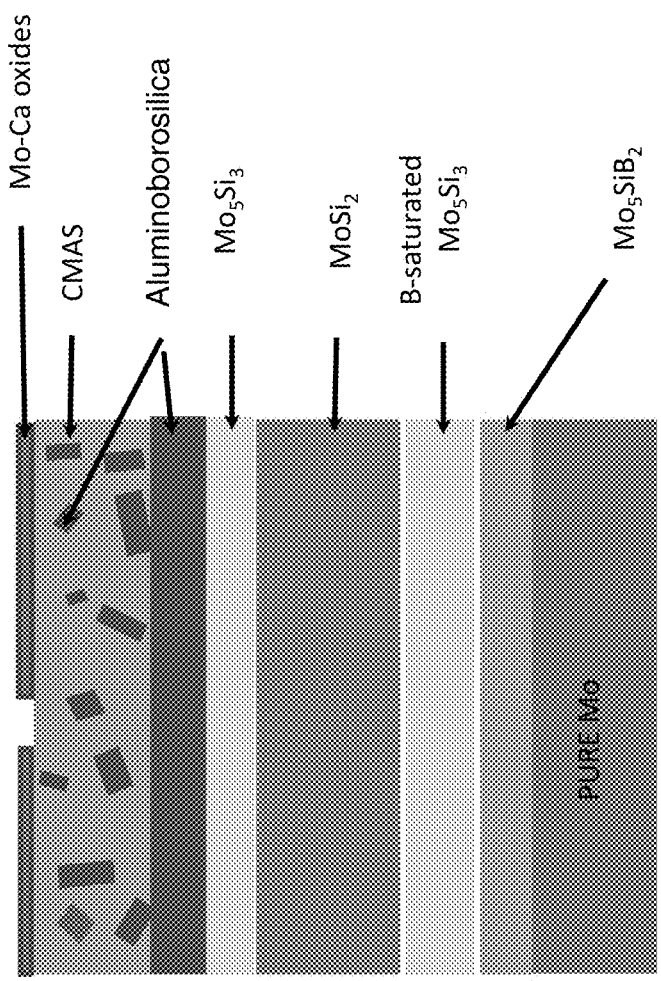
FIG. 13 is a schematic diagram of a cross-section of an Mo substrate coated with a multilayered MoSiB-based coating that includes a layer of aluminoborosilicate glass.

FIG. 12 shows an SEM image of a cross-section of a Mo substrate coated with a multilayered MoSiB-based coating that includes a layer of aluminoborosilicate glass. The sample from which this image was obtained was coated with CMAS sand C1 and oxidized for 25 hours at 1400° C. in air. As shown in the SEM image, particles of aluminoborosilica formed where the CMAS sand interacted with the protective coating. A schematic diagram showing a cross-section of the substrate and multilayered coating is provided in FIG. 13.

SEM images were also taken of the coated structure after exposure to the CMAS sand at 1500° C. for 25 hours. The microstructure of sample taken at the higher temperature exposure was similar, although there was an increase in the size of the aluminoborosilica crystal particles in the interaction area. In addition, SEM images of a coated sample exposed to CMAS sand A for 25 hours at 1500° C. in air exhibited an outer shell comprised of a Mo—Ca oxide with a Mo:Ca ratio of about 1:1 (based on EDS). Based on the ternary phase diagram for Mo—Ca—O at 1000° C. and the Mo:Ca ratio, the oxide is believed to be $MoCaO_4$. The aluminoborosilica particles in the SEM showed up as dark spots surrounded by a CMAS "ring".

Based on these studies, it was concluded that the interaction of the multilayered MoSiB coatings with the CMAS sand resulted in the CMAS being depleted of calcium (likely due to the formation of $MoCaO_4$), resulting in a CMAS structure that is more easily crystallized. As a result, the CMAS becomes immobile and the interaction between the sand and the MoSiB coating is inhibited.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A coated ceramic-based structure comprising:
   (a) a substrate comprising a ceramic; and
   (b) an oxidation-resistant coating comprising a continuous layer of an aluminoborosilicate glass on a surface of the substrate; wherein the oxidation-resistant coating is characterized in that it remains intact on the surface of the substrate when the coated substrate is exposed to a temperature of at least 1200° C. in an oxidizing air environment for a period of at least one hour and reduces the rate at which oxygen diffuses to the surface of the substrate to an extent sufficient to prevent the formation of an oxide scale on the surface of the substrate when the coated substrate is exposed to a temperature of at least 1200° C. in an oxidizing air environment for a period of at least one hour.

2. The structure of claim 1, wherein the substrate comprises a ceramic having a melting point of at least 1600° C.

3. The structure of claim 1, wherein the substrate comprises SiC.

4. The structure of claim 3, wherein the substrate comprises a SiC—$ZrB_2$ composite.

5. The structure of claim 1, wherein the substrate is a cermet.

6. The structure of claim 1, wherein the coating further comprises molybdenum.

7. The structure of claim 1, wherein the amount of aluminum in the aluminoborosilicate glass is in the range from 1 to about 15 atomic percent.

8. The structure of claim 1, wherein the substrate is a refractory metal cermet.

9. The structure of claim 1, wherein the oxidation-resistant coating is characterized in that it remains intact on the surface of the substrate when the coated substrate is exposed to a temperature of at least 1500° C. in an oxidizing air environment for a period of at least six hours and reduces the rate at which oxygen diffuses to the surface of the substrate to an extent sufficient to prevent the formation of an oxide scale over the surface of the substrate when the coated substrate is exposed to a temperature of at least 1500° C. in an oxidizing air environment for a period of at least six hours.

10. The structure of claim 9, wherein the substrate comprises SiC.

11. The structure of claim 1, wherein the oxidation-resistant coating is characterized in that it remains intact on the surface of the substrate when the coated substrate is exposed to a temperature of at least 1650° C. in an oxidizing air environment for a period of at least five hours and reduces the rate at which oxygen diffuses to the surface of the substrate to an extent sufficient to prevent the formation of an oxide scale over the surface of the substrate when the coated substrate is exposed to a temperature of at least 1650° C. in an oxidizing air environment for a period of at least five hours.

12. The structure of claim 11, wherein the substrate comprises a SiC—$ZrB_2$ composite.

13. The structure of claim 11, wherein the oxidation-resistant coating is characterized in that it remains intact on the surface of the substrate when the coated substrate is exposed to a temperature of at least 1750° C. in an oxidizing air environment for a period of at least five hours and reduces the rate at which oxygen diffuses to the surface of the substrate to an extent sufficient to prevent the formation of an oxide scale over the surface of the substrate when the coated substrate is exposed to a temperature of at least 1750° C. in an oxidizing air environment for a period of at least five hours.

14. The structure of claim 1, wherein the substrate comprises a turbine blade.

15. The structure of claim 1, wherein ceramic substrate is a ceramic thermal barrier coating on an underlying turbine blade.

16. The structure of claim 14, wherein the ceramic thermal barrier coating is yttria-stabilized zirconia.

* * * * *